US009768591B1

(12) United States Patent
Nguyen et al.

(10) Patent No.: US 9,768,591 B1
(45) Date of Patent: Sep. 19, 2017

(54) PDU WITH FRONT SIDE ACCESS TO TRANSFORMER COMPARTMENT

(71) Applicant: POWER DISTRIBUTION, INC., Richmond, VA (US)

(72) Inventors: Long Justin Nguyen, Mechanicsville, VA (US); Isaac Folk, Glen Allen, VA (US); Christopher Morgan Davis, Richmond, VA (US); Mingbo Zhao, Doylestown, PA (US)

(73) Assignee: POWER DISTRIBUTION, INC., Richmond, VA (US)

( * ) Notice: Subject to any disclaimer, the term of this patent is extended or adjusted under 35 U.S.C. 154(b) by 0 days.

(21) Appl. No.: 15/254,992

(22) Filed: Sep. 1, 2016

Related U.S. Application Data

(60) Provisional application No. 62/309,858, filed on Mar. 17, 2016.

(51) Int. Cl.
*A47B 81/00* (2006.01)
*H02B 1/32* (2006.01)
*H02B 1/30* (2006.01)

(52) U.S. Cl.
CPC .............. *H02B 1/32* (2013.01); *H02B 1/305* (2013.01); *H02B 1/306* (2013.01)

(58) Field of Classification Search
CPC ........... H02B 1/32; H02B 1/305; H02B 1/306
USPC ....................................................... 312/291
See application file for complete search history.

(56) References Cited

U.S. PATENT DOCUMENTS

| 5,378,058 | A | * | 1/1995 | Tessmer | .................. | H02B 1/50 312/223.6 |
| 5,393,942 | A | * | 2/1995 | Reiner | ..................... | H01H 9/26 200/50.4 |
| 6,563,048 | B2 | * | 5/2003 | Holt | ....................... | H02B 1/308 174/50 |
| 6,964,463 | B1 | * | 11/2005 | Hindle | ................... | H01M 2/10 312/291 |
| 8,378,530 | B1 | * | 2/2013 | Morales | .............. | H05K 7/1492 307/147 |
| 2002/0157846 | A1 | * | 10/2002 | Baker | ..................... | H02B 1/32 174/50 |
| 2004/0231875 | A1 | * | 11/2004 | Rasmussen | ............ | G06F 1/189 174/50 |
| 2005/0094357 | A1 | * | 5/2005 | Ewing | ............... | H01H 85/0241 361/626 |

(Continued)

*Primary Examiner* — Hanh V Tran
(74) *Attorney, Agent, or Firm* — Bacon & Thomas, PLLC

(57) ABSTRACT

A PDU enclosure defines a transformer compartment for receiving a transformer. The PDU enclosure includes a first side bulkhead and a second side bulkhead positioned adjacent to each other as viewed on a plane. The first side bulkhead and the second side bulkhead limit access to the transformer compartment from the front. The first side bulkhead defines an opening to the transformer compartment and is spaced from the second side bulkhead by a gap. The PDU enclosure further includes a removable access panel. The removable access panel includes a first portion removably coupled to the first side bulkhead and that covers the opening in the first side bulkhead, and a second portion extending at an angle relative to the first portion and removably coupled to the second side bulkhead. The second portion also covers the gap between the first side bulkhead and the second side bulkhead.

20 Claims, 6 Drawing Sheets

(56) References Cited

U.S. PATENT DOCUMENTS

| | | | | |
|---|---|---|---|---|
| 2010/0139908 A1* | 6/2010 | Slessman | ............... | F28F 9/0265 165/279 |
| 2011/0310534 A1* | 12/2011 | Cosley | .................... | H02B 1/32 361/632 |
| 2012/0273438 A1* | 11/2012 | Nordin | ................... | H04Q 1/025 211/26 |
| 2014/0247537 A1* | 9/2014 | Nordin | ................. | H05K 7/1492 361/622 |
| 2014/0254085 A1* | 9/2014 | Slessman | ............... | B31B 43/00 361/679.31 |
| 2014/0262489 A1* | 9/2014 | Laye | ........................ | H02B 1/32 174/541 |
| 2015/0062806 A1* | 3/2015 | Shelnutt | ................ | H05K 7/203 361/679.53 |

* cited by examiner

PDU WITH FRONT SIDE ACCESS TO TRANSFORMER COMPARTMENT

CROSS REFERENCE TO RELATED APPLICATION

This application claims the benefit and priority of U.S. Provisional Patent Application No. 62/309,858 entitled PDU with Front Side Access to Transformer Compartment, filed on Mar. 17, 2016, which is hereby incorporated by reference herein in its entirety.

BACKGROUND

1. Field of the Invention

The invention relates to a power distribution unit (PDU) having a removable access panel on a front for providing access to a transformer compartment of the PDU.

2. Description of the Related Art

A power distribution unit, or PDU, is a device used for providing power to electronic components, such as racks of computers and networking equipment. A PDU includes one or more input ports for receiving input power. The PDU also includes output ports for providing output power. The PDU also includes a transformer that receives the input power, converts the input power to a power signal usable by the electronic components, and then outputs the power signal(s) to the output ports.

PDUs used for powering racks of computing equipment are typically provided as a rack mount PDU or as a cabinet type PDU. A rack mount PDU is typically smaller than a cabinet type PDU and is designed such that it can be positioned in a rack designed for receiving computing equipment. A cabinet type PDU has an outer casing that resembles a cabinet used for housing typical racks of computer equipment. The cabinet type PDU may include various features such as input ports, output ports, circuit breakers, power and temperature monitoring systems, and the like.

The connections of a transformer used in a cabinet type PDU are typically positioned at a front end of the PDU enclosure. In a conventional PDU, access to the transformer from the front of the PDU is prohibited due to placement of components on a front-side bulkhead. If a customer wants front-side access to a conventional PDU, the customer must purchase an extra enclosure, called a sidecar, and permanently place the components on the sidecar. Thus, in order to provide front-side access in a conventional PDU, purchase of a sidecar is required which undesirably increases both total cost and total size of a PDU.

Thus, there is a need for systems and methods for a PDU that provides front side access to transformer connections without requiring use of a sidecar.

SUMMARY

Described herein is a cabinet-type power distribution unit (PDU) enclosure for allowing access to a transformer from a front of the PDU enclosure. The PDU enclosure includes an outer casing at least partially defining a transformer compartment for receiving the transformer. The PDU enclosure further includes a first side bulkhead and a second side bulkhead each coupled to the outer casing and positioned adjacent to each other as viewed on a plane from the front of the PDU enclosure. The first side bulkhead and the second side bulkhead at least partially limit access to the transformer compartment from the front of the PDU enclosure. Furthermore, the first side bulkhead defines an opening to the transformer compartment and is spaced from the second side bulkhead by a gap in a direction perpendicular to the plane. The PDU enclosure further includes a removable access panel. The removable access panel includes a first portion configured to be removably coupled to the first side bulkhead and to at least partially cover the opening in the first side bulkhead. The removable access panel further includes a second portion extending at an angle relative to the first portion and is designed to be removably coupled to the second side bulkhead. The second portion of the removable access panel is also designed to at least partially cover the gap between the first side bulkhead and the second side bulkhead.

Also described is a cabinet-type power distribution unit (PDU) enclosure for allowing access to a transformer from a front of the PDU enclosure. The PDU enclosure includes an outer casing at least partially defining a transformer compartment for receiving the transformer. The PDU enclosure also includes a first side bulkhead coupled to the outer casing, at least partially limiting access to the transformer, defining an opening to the transformer compartment, and positioned along a plane. The PDU enclosure also includes a second side bulkhead coupled to the outer casing, at least partially limiting access to the transformer, and oriented parallel to the plane. The second side bulkhead is spaced from the first side bulkhead by a gap in a direction perpendicular to the plane. The PDU enclosure also includes a removable access panel. The removable access panel includes a first portion designed to be removably coupled to the first side bulkhead and to at least partially cover the opening in the first side bulkhead. The removable access panel further includes a second portion extending at an angle relative to the first portion and is designed to be removably coupled to the second side bulkhead and to at least partially cover the gap between the first side bulkhead and the second side bulkhead.

Also described is a cabinet-type power distribution unit (PDU) enclosure for allowing access to a transformer from a front of the PDU enclosure. The PDU enclosure includes an outer casing at least partially defining a transformer compartment for receiving the transformer. The PDU enclosure also includes a first side bulkhead and a second side bulkhead each coupled to the outer casing, positioned adjacent to each as viewed on a plane from the front of the PDU enclosure, and at least partially limiting access to the transformer compartment from the front of the PDU enclosure. The first side bulkhead defines an opening to the transformer compartment and is recessed relative to the second side bulkhead. The first side bulkhead is spaced from the second side bulkhead by a gap in a direction perpendicular to the plane. The PDU enclosure further includes a removable access panel. The removable access panel includes a first portion designed to be removably coupled to the first side bulkhead and to at least partially cover the opening in the first side bulkhead. The removable access panel further includes a second portion extending at an angle relative to the first portion and is designed to be removably coupled to the second side bulkhead. The second portion of the removable access panel at least partially closes the gap between the first side bulkhead and the second side bulkhead. The removable access panel further includes a third portion positioned parallel and adjacent to the first portion such that the first portion is positioned between the second portion and the third portion. The third portion of the removable access panel is designed to at least partially cover the opening in the first side bulkhead.

DETAILED DESCRIPTION

Figure 1:
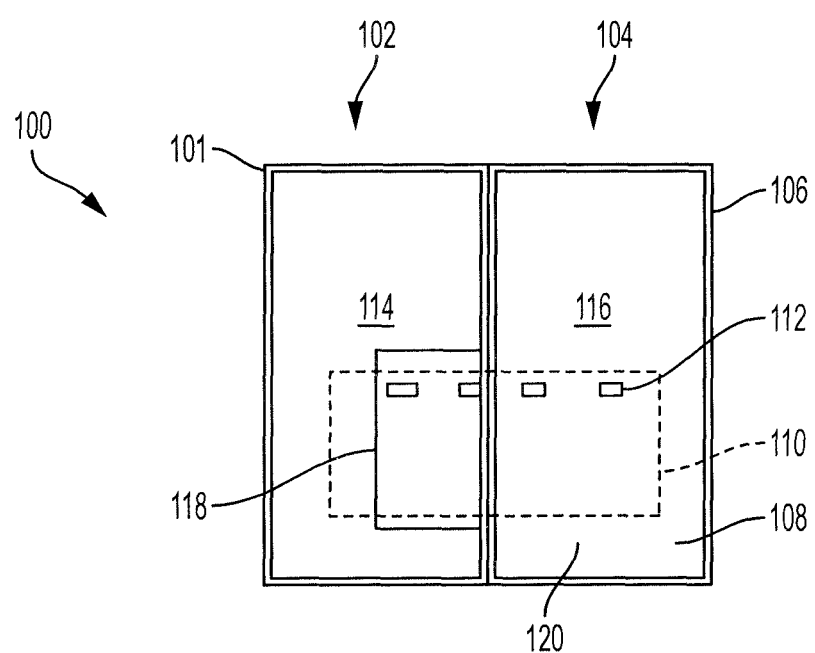
FIG. 1 is a block diagram illustrating components of a power distribution unit (PDU) that provides front-side access to a transformer housed in an outer casing according to an embodiment of the present invention.

Referring to FIG. 1, a power distribution unit (PDU) 100 includes a PDU enclosure 101 for relatively easy front-side access into the PDU 100. The PDU 100 may include the PDU enclosure 101, a transformer 110, and various other components (not shown).

The transformer 110 may include one or more transformer connections 112. Some of the transformer connections 112 may receive a supply power from a power source. The transformer 110 may convert the received power into a form usable by electronic equipment. Some of the transformer connections 112 may be output ports for outputting the converted power as output power. In some embodiments, the PDU 100 may include additional components such as a power monitoring system, a thermal monitoring system, one or more circuit breakers, or the like.

The PDU enclosure 101 has a first side 102 and a second side 104 positioned adjacent to the first side 102. In some embodiments, the first side 102 may be referred to as a left side and the second side 104 may be referred to as a right side.

The PDU enclosure 101 also includes an outer casing 106. The outer casing 106 at least partially defines a transformer compartment 108. The transformer compartment 108 is a volume within the outer casing 106 in which the transformer 110 may be housed.

The PDU enclosure 101 further includes a first side bulkhead 114 and a second side bulkhead 116. The first side bulkhead 114 and the second side bulkhead 116 may each at least partially define the transformer compartment 108. Furthermore, one or more components may be coupled to or mounted on the first side bulkhead 114 and one or more components may be coupled to or mounted on the second side bulkhead 116. In some embodiments, components mounted on the first side bulkhead 114 may be input components and components mounted on the second side bulkhead 116 may be output components.

Occasionally, it is desirable to be able to access the transformer 110 via a front 120 of the PDU enclosure 101. The PDU enclosure 101 eliminates the requirement of using a sidecar by providing an opening (such as an opening 218 of FIG. 2) in the first side bulkhead 114 that is covered by a removable access panel 118. Thus, in order to access the transformer 110 via the front 120 of the PDU enclosure 101, the removable access panel 118 may be removed and the transformer 110 may be accessed via the opening in the first side bulkhead 114.

The removable access panel 118 may include sheet-metal, such as aluminum or steel sheet-metal, or a non-metallic material. The removable access panel 118 may be formed in various manners such as casting, forging, forming, molding, or any other manufacturing process capable of forming the removable access panel 118.

Figure 2:
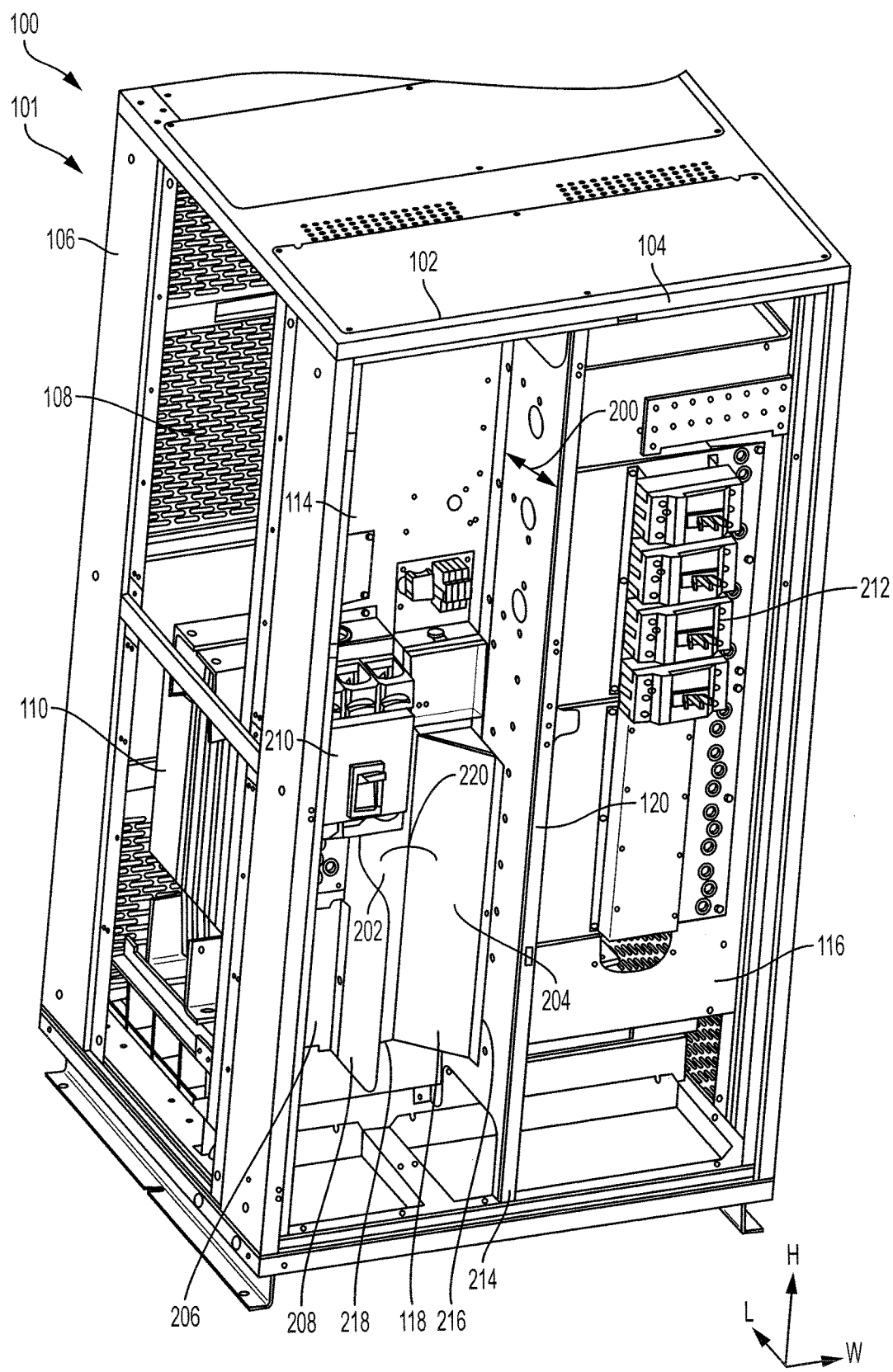
FIG. 2 is a perspective view of the PDU of FIG. 1 illustrating a bulkhead that at least partially defines a transformer compartment and a removable access panel that allows front side access to the transformer compartment according to an embodiment of the present invention.

In FIG. 2, additional features of the PDU 100 are made apparent. A W-L-H axis, corresponding to a width, length, and height of the PDU enclosure 101, is shown to illustrate relative positioning of components of the PDU 100. The terms length, width, and height are used as reference directions only. For example, one skilled in the art may call the length of the PDU 100 a width or a height without departing from the scope of the invention.

As shown in FIG. 2, and as can be seen in FIG. 1, the first side bulkhead 114 and the second side bulkhead 116 appear adjacent to each other when viewed from the front 120 of the PDU 100. Stated differently, the first side bulkhead 114 and the second side bulkhead 116 appear adjacent when viewed on the W-H plane, and are adjacent along the W axis. However, the first side bulkhead 114 is recessed into the outer casing 106 relative to the second side bulkhead 116. Thus, the first side bulkhead 114 is separated from the second side bulkhead 116 by a gap 200. The gap 200 exists in a direction perpendicular to the W-H plane.

A sidewall 214 may exist in the L-H plane from the first side bulkhead 102 to the second side bulkhead 104. The sidewall 214 may at least partially define the transformer compartment 108. The sidewall 214 may also define an opening 216 into the transformer compartment 108 along the W axis. Thus, the transformer 110 may be accessed via the opening 216 and the sidewall 214 and via an opening 218 in the first side bulkhead 114.

The removable access panel 118 may include one or more portions including a first portion 202, a second portion 204, and a third portion 206. The first portion 202 may at least partially cover the opening 218 in the first side bulkhead 114. The second portion 204 may extend towards the second side bulkhead 116 from the first portion 202. The second portion 204 may be oriented at an angle 220 relative to the first portion 202. In that regard, the second portion 204 may partially cover the opening 218 in the first side bulkhead 114 and may at least partially cover the opening 216 in the sidewall 214.

The angle 220 may have any value between 0 degrees and 180 degrees and may be selected based on the dimensions of the transformer 110.

The third portion 206 may be an optional portion. The third portion 206 may be positioned on an opposite side of the first portion 202 from the second portion 204. The third portion 206 may at least partially cover the opening 218 in the first side bulkhead 114.

The removable access panel 118 may also include a separator portion 208. In some embodiments, the separator portion 208 may be positioned between the first portion 202 and the third portion 206. The separator portion 208 may extend along the L-H plane and may be used as a routing guide for routing cables aligned with the first side bulkhead 114. For example, the first side bulkhead 114 may include one or more components 210 that may be coupled to cables. It is undesirable for the cables to be positioned over the opening 216 in the sidewall 214 or over the opening 218 in the first side bulkhead as this may impede access to the transformer 110. Thus, the separator portion 208 may encourage users to guide any cables to the left side of the separator portion 208, reducing the likelihood of cables impeding access to the transformer 110.

As with the first side bulkhead 114, the second side bulkhead 116 may also include one or more components 212. In some embodiments, the components 210 on the first side 102 of the PDU 100 may be components that correspond to inputs of the PDU 100 and the components 212 on the second side 104 may be components that correspond to outputs of the PDU 100.

Figure 3:
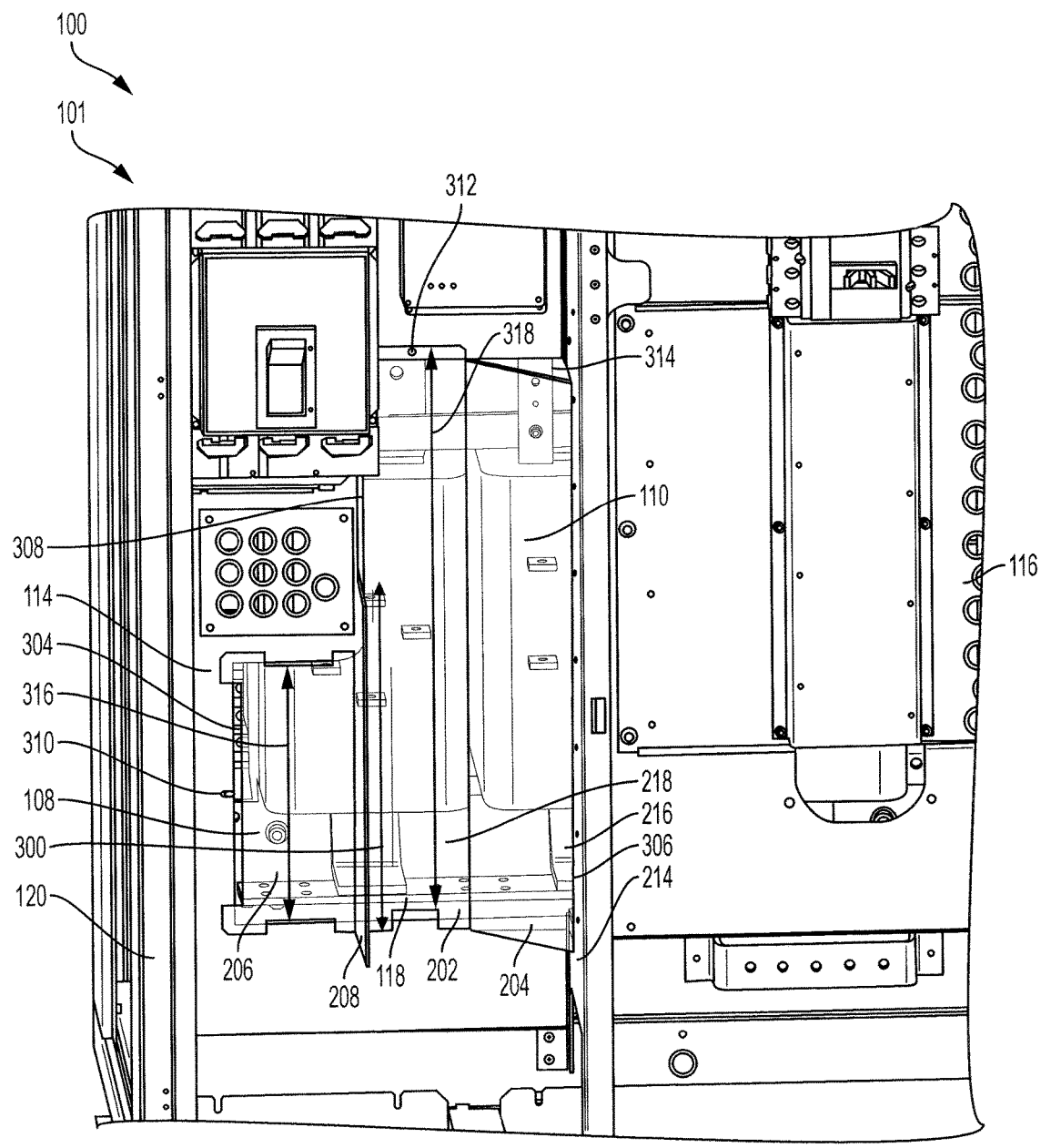
FIG. 3 is an enlarged view of a lower portion of the PDU of FIG. 1 with the removable access panel being transparent according to an embodiment of the present invention.

In FIG. 3, an enlarged view of a lower portion of the PDU enclosure 101 is shown. In FIG. 3, the removable access panel 118 is shown as transparent. As shown, the removable access panel 118 at least partially covers the opening 216 in the sidewall 214 and the opening 218 in the first side bulkhead 114. As shown, the transformer 110 is positioned behind the removable access panel 118 such that it may be accessed from the front 120 of the PDU enclosure 101 by removing the removable access panel 118.

It is undesirable for an opening to exist from outside of the transformer compartment 108 into the transformer compartment 108 because high voltages may be present within the transformer compartment 108. Thus, the removable access panel 118 includes additional material 314 that fills in the space at the top and the bottom of the second portion 204 between the second portion 204, the first side bulkhead 114, and the sidewall 214.

As shown, the third portion 206 of the removable access panel 118 may have a height 316 that is less than a height 318 of the first portion 202 and the second portion 204. In some embodiments, the heights of the first portion 202, second portion 204, and third portion 206 may be the same, may be different, or may be any combination thereof. Similarly, the separator portion 208 may have a height 300 that is between the height 316 of the third portion 206 and the height 318 of the first portion 202. In some embodiments, the separator portion 208 may have any other height.

The removable access panel 118 may include one or more flanges for facilitating alignment of the removable access panel 118 relative to the first side bulkhead 114 and the second side bulkhead 116. For example, the removable access panel 118 includes a first flange 304, a second flange 306, and a third flange 308. The flanges 304, 306, 308 may facilitate a sliding motion of the third portion 206 from right to left into its designed position relative to the first side bulkhead 114. Furthermore, use of the flanges 304, 306, 308 may resist separation of the removable access panel 118 relative to the bulkheads 114, 116, thus reducing a number of fasteners used to couple the removable access panel 118 to the bulkheads 114, 116.

In some embodiments, one or more portions of the removable access panel 118 may be separate from the remaining portions. For example, the third portion 206 may be separate from the first portion 202 and the second portion 204 and the first portion 202 and the second portion 204 may be integral. As another example, the first portion 202, the second portion 204, and the third portion 206 each may be integral with each other. In some embodiments, the separator portion 208 may be integral to a combined first portion 202 and second portion 204.

One or more fasteners may be included to removably couple the removable access panel 118 to the first side bulkhead 114, the second side bulkhead 116, the sidewall 214, or any other component of the PDU enclosure 101. For example, the removable access panel 118 may also or instead be coupled to the first side bulkhead 114 and to the sidewall 214. The removable access panel 118 may also be coupled to the second side bulkhead 116 either directly or indirectly. For example, a first fastener 310, such as a bolt, may be used to fasten the third portion 206 of the removable access panel 118 to the first side bulkhead 114. A second fastener 312 may be used to fasten the first portion 202 of the removable access panel 118 to the first side bulkhead 114. A third fastener (not shown) may be used to fasten the second portion 204 to the sidewall 214.

In some embodiments, any number of fasteners may be used. In some embodiments, no fasteners may be used. For example, the removable access panel 118 may be coupled to other components of the PDU enclosure 101 via a hinged door without the use of fasteners. In some embodiments, any other solution that can be removed or otherwise manipulated to provide access to the transformer compartment 108 may be used instead of the removable access panel 118.

In some embodiments, the sidewall may not be present and the removable access panel 118 may be coupled to the first side bulkhead 114 and the second side bulkhead 116. Where used herein, when a portion of the removable access panel 118 is coupled to a bulkhead, the coupling may be direct or indirect. For example, when the second portion 204 is coupled to the second side bulkhead 116, the second portion 204 may be directly coupled to the second side bulkhead 116 or may be coupled to the second side bulkhead 116 via the sidewall 214.

In order to remove the removable access panel 118 from the PDU enclosure 101 to access the transformer 110, the fasteners 310, 312 may be removed from the removable access panel 118. Afterwards, the removable access panel 118 may be removed from its position relative to the PDU enclosure 101. For example, the entire removable access panel 118 may be removed from its position.

In some embodiments in which the third portion 206 is separate from the first portion 202 and the second portion 204, the first portion 202 and the second portion 204 may be initially removed from the PDU enclosure 101. Afterwards, the third portion 206 may be removed from the PDU enclosure 101. In some embodiments, the third portion 206 may be slidably engaged with the first side bulkhead 114 such that it may slide in and out of place. In that regard, the third portion 206 may be slid to the right into the portion of the opening 218 that was covered by the first portion 202 and then removed from the PDU enclosure 101.

In order to re-attach the removable access panel 118, the third portion 206 may be placed into the opening 218 and slid into place by sliding left. The first flange 304 may facilitate alignment of the third portion 206. The first portion 202 and the second portion 204 may be put in place relative to the first side bulkhead 114 and the second side bulkhead 116. The second flange 306 may facilitate alignment of the second portion 204 relative to the sidewall 214 and the third flange 308 may facilitate alignment of the first portion 202 relative to the first side bulkhead 114.

Figure 4:
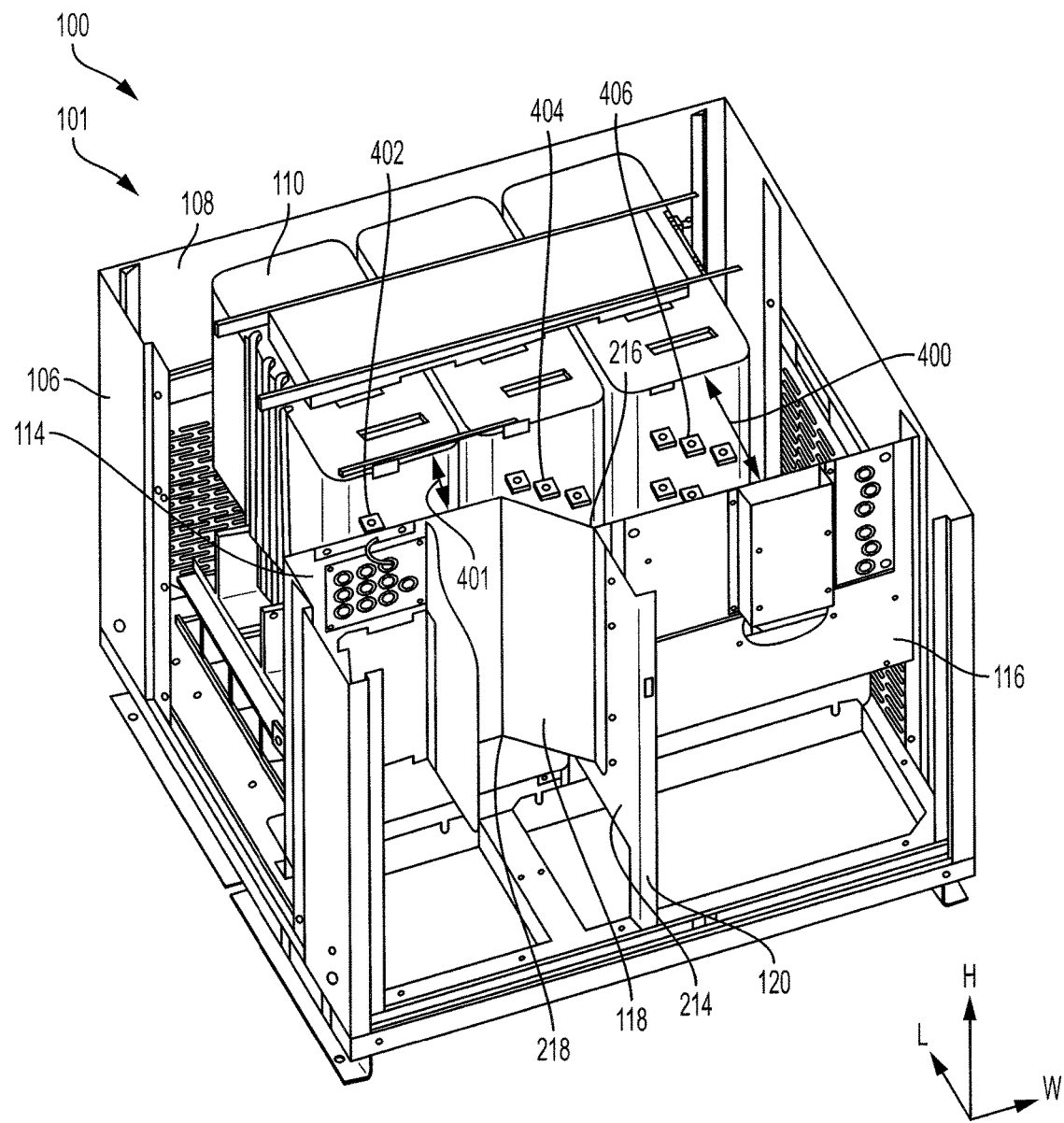
FIG. 4 is a cross-sectional view of the PDU of FIG. 1 illustrating how recessing a first bulkhead relative to a second bulkhead provides access to transformer connections behind the first bulkhead and the second bulkhead via an opening in the first bulkhead according to an embodiment of the present invention.

In FIG. 4, a cross-sectional perspective view of the PDU 100 is shown. As shown in FIG. 4, the transformer 110 may include multiple connectors on its front side. For example, the transformer 110 may include connectors 402 on a left side of the front, connectors 404 on a middle of the front, and connectors 406 on the right side of the front. The connectors 402 may be positioned behind the first side bulkhead 114 and the connectors 406 may be positioned behind the second side bulkhead 116. The connectors 402, 404, 406 may include any connectors such as taps, busbars (not shown), or other types of connectors used in PDU systems.

Because the first side bulkhead 114 is recessed relative to the second side bulkhead 116, the second side bulkhead 116 is spaced from the transformer 110 by a distance 400 that is greater than a distance 401 between the transformer 110 and the first side bulkhead 114. Due to the spacing, the transformer 110 may be accessed without forming an opening in the second side bulkhead 116.

As described above, in order to access the transformer 110, the removable access panel 118 may be removed. Because the connectors 402 are aligned with the removable access panel 118 in the L direction, a user may reach into the transformer compartment 108 through the opening 218 in the first side bulkhead 114 to reach the connectors 402 on the left side of the transformer 110.

The opening 218 in the first side bulkhead 114 is continuous with the opening 216 in the sidewall 214. Thus, a user may reach into the transformer compartment 108 through the opening 218 and/or the opening 216. Because the second side bulkhead 116 is spaced from the transformer 110 by a relatively large distance 400, a user may access the connectors 406 on the right side of the transformer 110 by reaching through the openings 216, 218 and through the space between the second side bulkhead 116 and the transformer 110. Thus, by spacing the second side bulkhead 116 from the transformer 110 by the distance 400, all connectors 402, 404, 406 of the transformer 110 may be accessed via the openings 216, 218.

In some embodiments, input components may require more space than output components. By placing input components on the first side bulkhead 114, the second side bulkhead 116 may be positioned farther to the front 120 than the first side bulkhead 114. Thus, in some embodiments, the larger input components are positioned on the first side bulkhead 114 and the smaller output components are positioned on the second side bulkhead 116 such that the second side bulkhead 116 may be spaced from the transformer 110 by the distance 400 without increasing the size of the outer casing 106.

The PDU 100 thus includes various features that, when combined, provide relatively easy access to the connectors 402, 404, 406 of the transformer 110 from the front 120 of the PDU 100 while keeping the size of the PDU 100 relatively small. By forming the opening 218 in the first side bulkhead 114, the transformer compartment 108 may be accessed from the front 120 of the PDU 100. By spacing the second side bulkhead 116 from the transformer 110 by the distance 400, the connectors 406 on the right side of the PDU 100 may be accessed. By recessing the first side bulkhead 114 relative to the second side bulkhead 116, the length of the PDU 100 may remain relatively small by placing the larger input components on the first side bulkhead 114.

Figure 5:
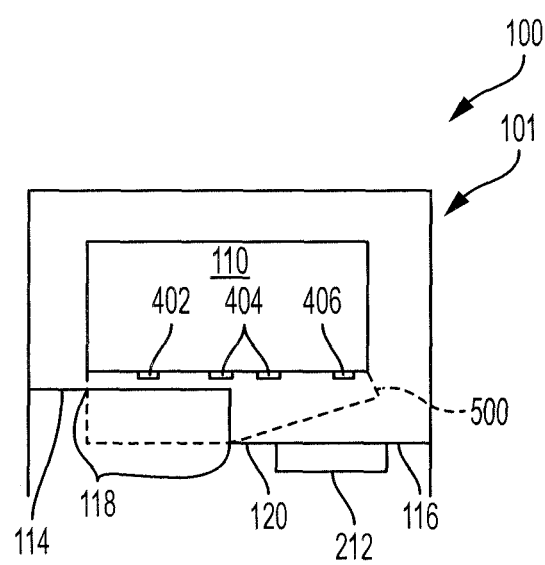
FIG. 5 is a schematic drawing of the PDU of FIG. 1 from a top view illustrating a volume of the transformer compartment of FIG. 2 that is accessible by removing the removable access panel of FIG. 2 according to an embodiment of the present invention.

In FIG. 5, a top down view of the PDU 100 is shown. As shown, the connectors 402, 404, 406 of the transformer 110 span from the left side of the transformer 110 to the right side of the transformer 110. Due to the factors discussed above, the PDU 100 may have a volume 500 that is accessible by removing the removable access panel 118. As shown, the connectors 402, 404, 406 of the transformer 110 are all positioned within the volume 500.

Figure 6:
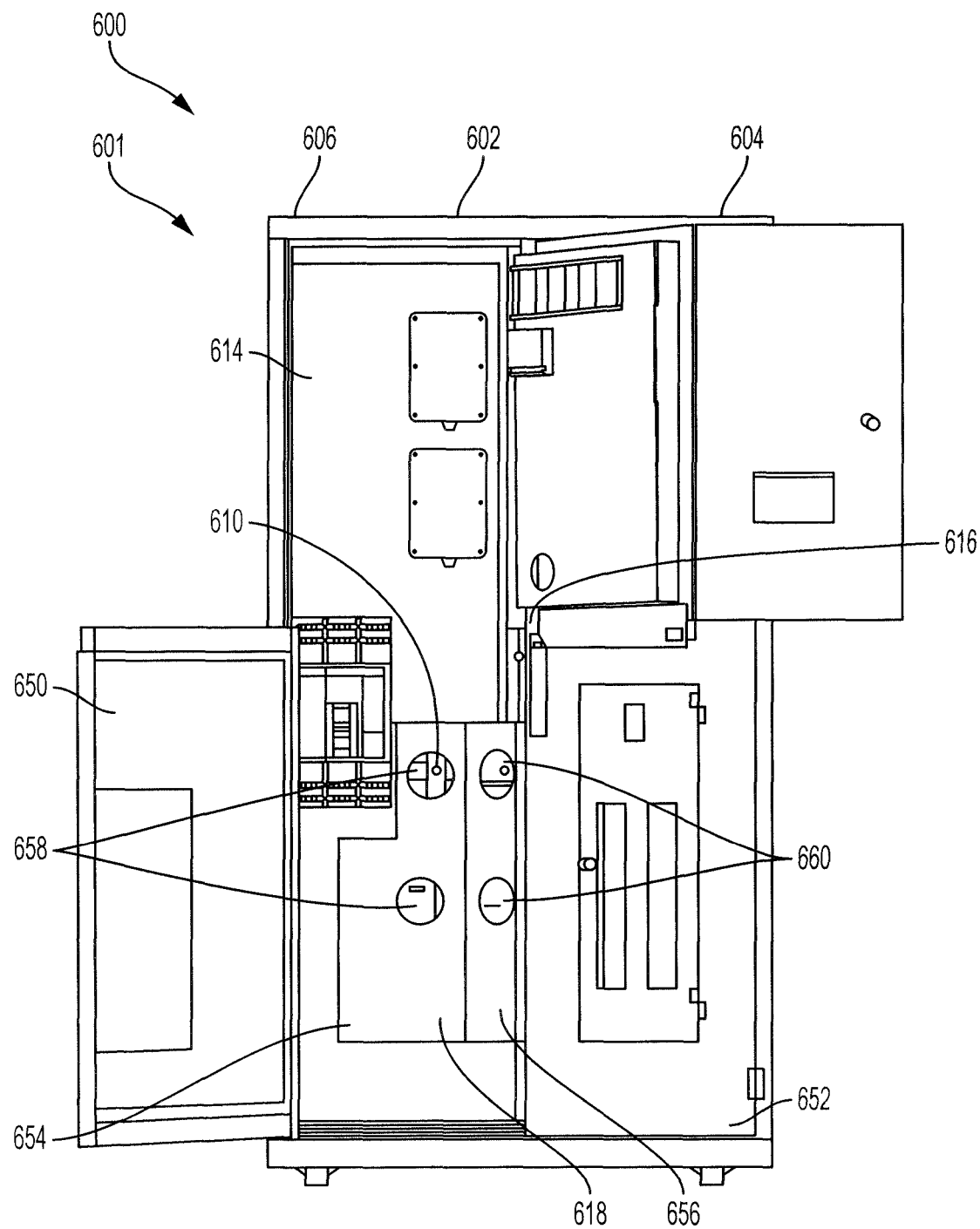
FIG. 6 is a drawing of a PDU that includes two bulkheads and a removable access panel for allowing front-side access to a transformer compartment and that defines one or more apertures for infrared temperature sensing of connections of a transformer according to an embodiment of the present invention.

In FIG. 6, another PDU 600 is shown. The PDU 600 includes a PDU enclosure 601 enclosing a transformer 610. The PDU enclosure 601 has a first side 602 and a second side 604. The PDU enclosure 601 further includes an outer casing 606, a first side bulkhead 614, and a second side bulkhead 616.

The first side bulkhead 614 defines an opening that is covered by a removable access panel 618. The removable access panel 618 includes a first portion 654 and a second portion 656. The removable access panel 118 further defines a plurality of apertures including one or more aperture 658 defined by the first portion 654 and one or more apertures 660 defined by the second portion 656. The apertures 658, 660 are oriented in such a way that an infrared thermometer device may be directed towards each of the connectors (not shown) of the transformer 610. Thus, a user may detect temperatures of connectors of the transformer 610 by directing the infrared beam from the device towards the connectors without removing the removable access panel 618.

The PDU enclosure 601 may further include one or more doors for providing access to the various portions of the PDU 600. For example, a first side door 650 may provide access to a portion of the first side bulkhead 614 and a second side door 652 may provide access to a portion of the second side bulkhead 616.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A cabinet-type power distribution unit (PDU) enclosure for allowing access to a transformer from a front of the PDU enclosure comprising:
   an outer casing at least partially defining a transformer compartment for receiving the transformer;
   a first side bulkhead and a second side bulkhead each coupled to the outer casing, positioned adjacent to each other as viewed on a plane from the front of the PDU enclosure, and at least partially limiting access to the transformer compartment from the front of the PDU enclosure, the first side bulkhead defining an opening to the transformer compartment and being spaced from the second side bulkhead by a gap in a direction perpendicular to the plane; and
   a removable access panel having:
     a first portion configured to be removably coupled to the first side bulkhead and to at least partially cover the opening in the first side bulkhead, and
     a second portion extending at an angle relative to the first portion and configured to be removably coupled to the second side bulkhead and to at least partially cover the gap between the first side bulkhead and the second side bulkhead.

2. The PDU enclosure of claim 1 wherein the removable access panel further includes a third portion having a height that is less than the first portion and the second portion and configured to at least partially cover the opening in the first side bulkhead, wherein the first portion is positioned between the second portion and the third portion.

3. The PDU enclosure of claim 2 wherein the removable access panel further includes a separator portion positioned between the first portion and the third portion and extending towards the front of the PDU enclosure from the first portion and the third portion and configured to at least partially define a routing channel for cables.

4. The PDU enclosure of claim 1 wherein the removable access panel includes sheet metal steel formed into the first portion and the second portion.

5. The PDU enclosure of claim 1 wherein the first side bulkhead is positioned to the left of the second side bulkhead when viewed from the front of the PDU enclosure and the first side bulkhead is recessed relative to the second side bulkhead such that the second side bulkhead is nearer to the front of the PDU enclosure than the first side bulkhead.

6. The PDU enclosure of claim 5 wherein the first side bulkhead includes an input component mounting space configured to receive input components corresponding to inputs of the transformer and the second side bulkhead includes an output component mounting space configured to receive output components corresponding to outputs of the transformer.

7. The PDU enclosure of claim 1 wherein the transformer may be accessed from the front of the PDU enclosure while the first side bulkhead and the second side bulkhead remain coupled to the outer casing by removing the removable access panel.

8. The PDU enclosure of claim 1 wherein the removable access panel defines at least one aperture configured to allow a thermal reading of a connection of the transformer while the removable access panel is coupled to the first side bulkhead and the second side bulkhead.

9. The PDU enclosure of claim 1 wherein the removable access panel includes at least one flange configured to interface with the first side bulkhead or the second side bulkhead to facilitate alignment of the removable access panel relative to the first side bulkhead and the second side bulkhead.

10. A cabinet-type power distribution unit (PDU) enclosure for allowing access to a transformer from a front of the PDU enclosure comprising:
an outer casing at least partially defining a transformer compartment for receiving the transformer;
a first side bulkhead coupled to the outer casing, at least partially limiting access to the transformer, defining an opening to the transformer compartment, and positioned along a plane;
a second side bulkhead coupled to the outer casing, at least partially limiting access to the transformer, and oriented parallel to the plane, the second side bulkhead being spaced from the first side bulkhead by a gap in a direction perpendicular to the plane; and
a removable access panel having:
a first portion configured to be removably coupled to the first side bulkhead and to at least partially cover the opening in the first side bulkhead, and
a second portion extending at an angle relative to the first portion and configured to be removably coupled to the second side bulkhead and to at least partially cover the gap between the first side bulkhead and the second side bulkhead.

11. The PDU enclosure of claim 10 wherein the removable access panel further includes a third portion having a height that is less than the first portion and the second portion and configured to at least partially cover the opening in the first side bulkhead, wherein the first portion is positioned between the second portion and the third portion.

12. The PDU enclosure of claim 10 wherein the first side bulkhead is positioned to the left of the second side bulkhead when viewed from the front of the PDU enclosure and the first side bulkhead is recessed relative to the second side bulkhead such that the second side bulkhead is nearer to the front of the PDU enclosure than the first side bulkhead.

13. The PDU enclosure of claim 12 wherein the first side bulkhead includes an input component mounting space configured to receive input components corresponding to inputs of the transformer and the second side bulkhead includes an output component mounting space configured to receive output components corresponding to outputs of the transformer.

14. The PDU enclosure of claim 10 wherein the transformer may be accessed from the front of the PDU enclosure while the first side bulkhead and the second side bulkhead remain coupled to the outer casing by removing the removable access panel.

15. The PDU enclosure of claim 10 wherein the removable access panel defines at least one aperture configured to allow a thermal reading of a connection of the transformer while the removable access panel is coupled to the first side bulkhead and the second side bulkhead.

16. The PDU enclosure of claim 10 wherein the removable access panel includes at least one flange configured to interface with the first side bulkhead or the second side bulkhead to facilitate alignment of the removable access panel relative to the first side bulkhead and the second side bulkhead.

17. A cabinet-type power distribution unit (PDU) enclosure for allowing access to a transformer from a front of the PDU enclosure comprising:
an outer casing at least partially defining a transformer compartment for receiving the transformer;
a first side bulkhead and a second side bulkhead each coupled to the outer casing, positioned adjacent to each as viewed on a plane from the front of the PDU enclosure, and at least partially limiting access to the transformer compartment from the front of the PDU enclosure, the first side bulkhead defining an opening to the transformer compartment and being recessed relative to the second side bulkhead such that the first side bulkhead is spaced from the second side bulkhead by a gap in a direction perpendicular to the plane; and
a removable access panel having:
a first portion configured to be removably coupled to the first side bulkhead and to at least partially cover the opening in the first side bulkhead, and
a second portion extending at an angle relative to the first portion and configured to be removably coupled to the second side bulkhead and to at least partially cover the gap between the first side bulkhead and the second side bulkhead, and
a third portion positioned parallel and adjacent to the first portion such that the first portion is positioned between the second portion and the third portion, the third portion being configured to at least partially cover the opening in the first side bulkhead.

18. The PDU enclosure of claim 17 wherein the first side bulkhead includes an input component mounting space configured to receive input components corresponding to inputs of the transformer and the second side bulkhead includes an output component mounting space configured to receive output components corresponding to outputs of the transformer.

19. The PDU enclosure of claim 17 wherein the transformer may be accessed from the front of the PDU enclosure while the first side bulkhead and the second side bulkhead remain coupled to the outer casing by removing the removable access panel.

20. The PDU enclosure of claim 17 wherein the removable access panel defines at least one aperture configured to allow a thermal reading of a connection of the transformer while the removable access panel is coupled to the first side bulkhead and the second side bulkhead.

\* \* \* \* \*